United States Patent [19]

Nagasawa

[11] Patent Number: 5,220,279
[45] Date of Patent: Jun. 15, 1993

[54] PROBE APPARATUS

[75] Inventor: Yasusi Nagasawa, Yamanashi, Japan

[73] Assignee: Tokyo Electron Yamanashi Limited, Nirasaki, Japan

[21] Appl. No.: 897,855

[22] Filed: Jun. 12, 1992

[30] Foreign Application Priority Data

Jun. 12, 1991 [JP] Japan .................................. 3-166265

[51] Int. Cl.⁵ .......................................... G01R 31/02
[52] U.S. Cl. ............................ 324/158 P; 324/158 F
[58] Field of Search ............ 324/158 R, 158 F, 158 P, 324/72.5; 439/482

[56] References Cited

U.S. PATENT DOCUMENTS 4,590,422  5/1986  Milligan ........................... 324/158 F

FOREIGN PATENT DOCUMENTS 0298171 12/1988  Japan ............................... 324/158 P
0000742  1/1989  Japan ............................... 324/158 P
64-55835  3/1989  Japan .
2-2939    1/1990  Japan .

Primary Examiner—Vinh Nguyen
Attorney, Agent, or Firm—Oblon, Spivak, McClelland, Maier & Neustadt

[57] ABSTRACT

A probe apparatus has a mount on which the object to be examined is placed, a large number of vertical probe needles, brought into contact with electrode pads of the object to be examined, for measuring the electrical characteristics of the object to be examined, and a cleaning block including a cleaning member for removing waste adhered to the vertical probe needles, the cleaning member including a cloth which is made up of extra fine fibers. Using the cleaning member, waste and the like adhered to the vertical probe needles can be removed, ensuring the long life of the vertical probe needles.

9 Claims, 7 Drawing Sheets

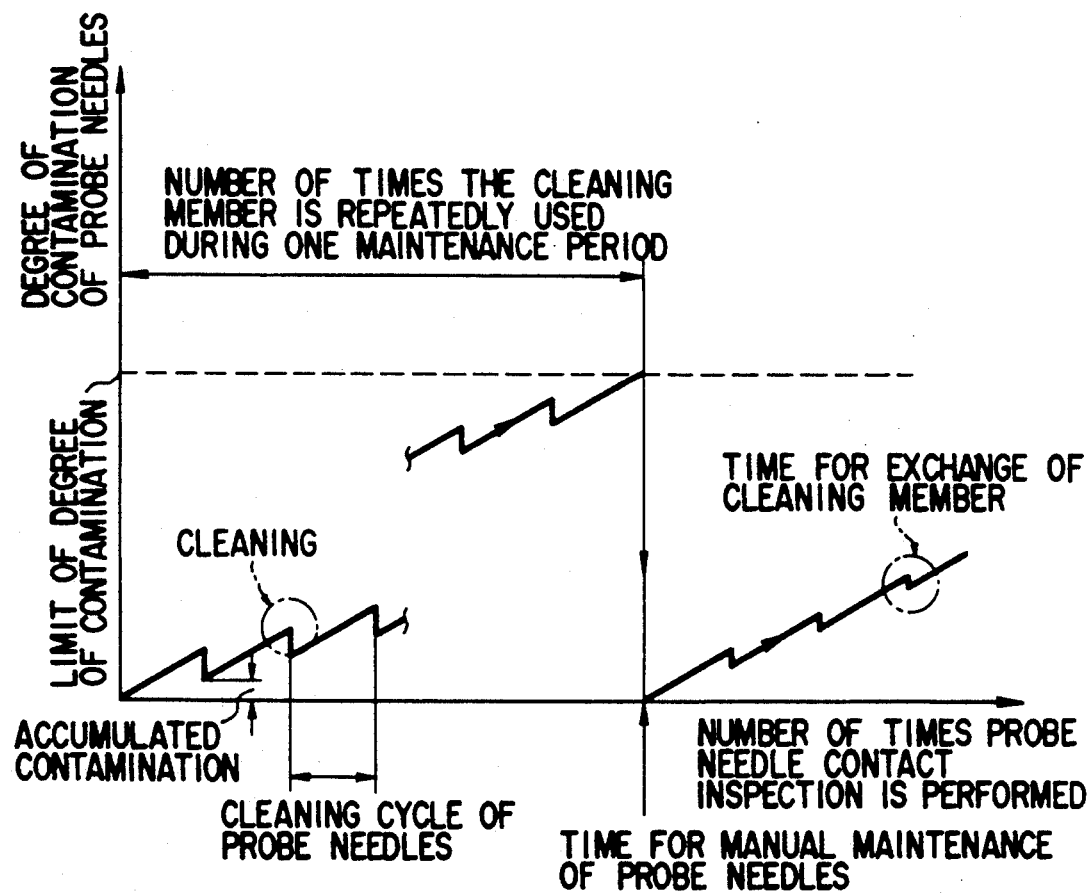
F I G. 7

PROBE APPARATUS

BACKGROUND OF THE INVENTION

1. Field of the Invention

The present invention relates to a probe apparatus, and more particularly to a probe apparatus having a mechanism for cleaning probe needles used to check the electrical characteristics of an object to be examined.

2. Description of the Related Art

In general, a probe apparatus for checking the electrical characteristics of an object to be examined has a mount, which can be moved vertically and horizontally and can be rotated in a horizontal plane, and a probe card including a large number of probes which are brought into contact with the electrodes formed on the object to be examined, such as a semiconductor wafer. The probe needles are affixed to the probe card such that they are inclined at a predetermined angle with respect to the probe card. The mount is moved to a predetermined position, and the probe needles are brought into contact with the electrode pads formed on the object to be examined which is placed on the mount, thus checking the electrical characteristics of the semiconductor wafer.

In recent years, the arrangement of electrode pads has become more and more complicated owing to the increasing complexity and microminiaturization of semiconductor devices, making it difficult for the inclined probe needles to accurately contact the electrode pads. In consideration of this, a method has been devised wherein probe needles, known as vertical probe needles which are arranged so as to extend vertically, are brought into contact with complexly arranged electrode pads. The vertical probe needles can accurately contact the electrode pads at uniform pressure.

Using the vertical probe needles, the electrical characteristics of the object to be examined can be measured accurately. However, there are cases where accurate measurements cannot be performed due to the following situation:

In general, probe needles are designed such that when they come into contact with the oxide films applied over aluminum electrode pads on a semiconductor wafer, they scratch the oxide films in order to attain electrical connection with the electrode pads. Especially in the case of vertical probe needles, aluminum waste easily adheres to the tips thereof. As the examination process is repeatedly performed, more and more aluminum waste is deposited on the tips, preventing the vertical probe needles from being electrically connected to the electrode pads, with the result that accurate measurements cannot be attained. The aluminum waste A deposited also shortens the life of the vertical probe needles. In addition, if the aluminum waste falls on the semiconductor wafer in the form of particles, it may degrade the quality of the semiconductor wafer.

SUMMARY OF THE INVENTION

It is therefore the object of the present invention to provide a probe apparatus having a mechanism for cleaning vertical probe needles in order to keep the probe needles in optimum condition for examination.

In order to attain this object, the probing apparatus of the present invention has a mount on which the object to be examined is placed, a large number of vertical probe needles which are brought into contact with the electrodes formed on the object to be examined in order to measure the electrical characteristics of the object to be examined, and a cleaning block including a cleaning member for removing aluminum waste A adhered to the vertical probe needles, the cleaning member comprising a cloth made up of extra fine fibers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 7 is a graph indicating the degree of contamination of the cleaning member and the time for exchanging the cleaning member for a new cleaning member.

DETAILED DESCRIPTION OF THE PREFERRED EMBODIMENTS

The preferred embodiment of the present invention will now be described in detail, with reference to the drawings.

Figure 1:
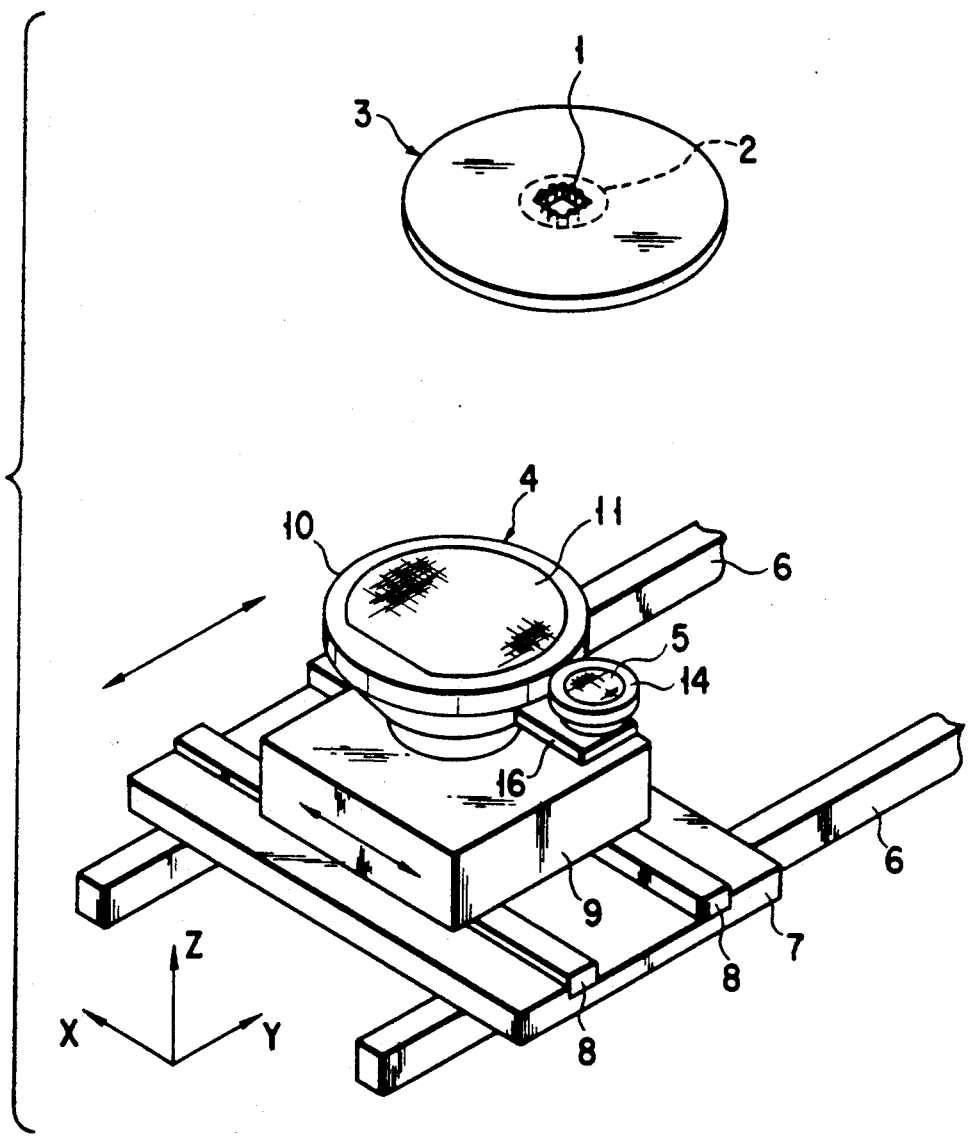
FIG. 1 is a diagrammatic perspective view of the main part of the probe apparatus according to the present invention.

FIG. 1 shows the main part of the probe apparatus according to the present invention. As can be seen in this drawing, a large number of probe needles 1 are affixed to a probe needle fixing block 2, which is attached to a probe card 3. The probe card 3 can be moved vertically by a lift means (not shown). A means for moving the probe card 3 in X and Y directions may be employed. A stage which can be moved in X, Y, and Z directions is arranged below the probe card 3, and a mount 4 is provided on the stage. Further, a cleaning block having a cleaning member 5 is arranged in the vicinity of the mount 4.

As shown in FIG. 1, the stage on which the mount 4 is provided includes a Y stage 7, an X stage 9, and a chuck 10. The Y stage 7 is movably arranged on Y-direction guide rails 6. The X stage 9 is movably arranged on X-direction guide rails 8, which are provided on the Y stage 7 and extend in the X direction, perpendicular to the Y direction. The chuck 10 is arranged above the X stage 9 so as to be rotatable and vertically movable. A suction means (not shown) is provided on the upper surface of the chuck 10 in order to hold, by means of suction, a semiconductor wafer 11 which is the object to be examined.

Figure 2:
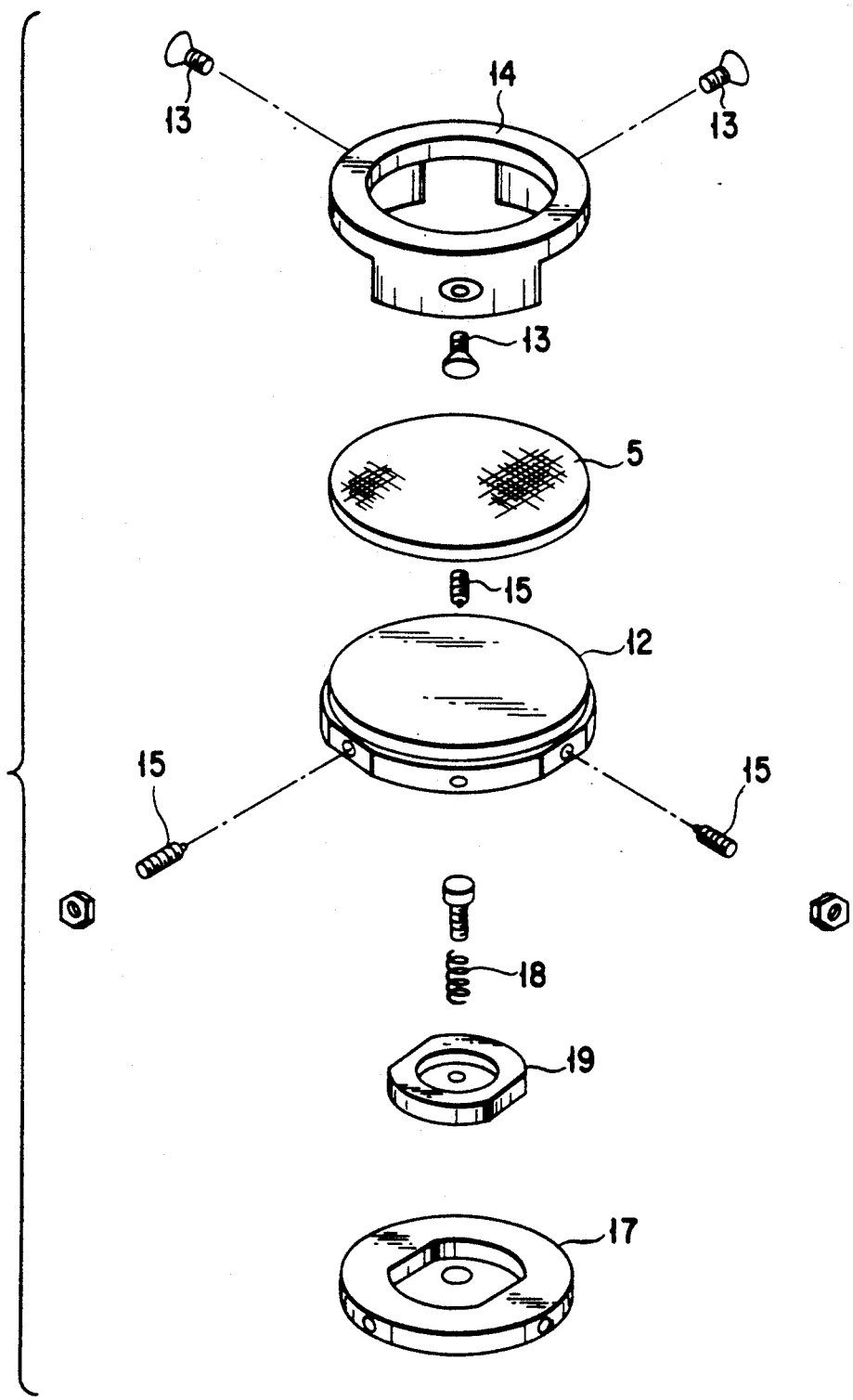
FIG. 2 is a perspective view of the cleaning block in a disassembled state.

The structure of the cleaning block is as shown in FIG. 2. The cleaning member 5 is adhered to the top of a cap-like base 12 having an opening which faces downward. A guide base 17 is arranged in this opening. The base 17 has an opening which faces upward, and a spring guide 19 is arranged in this opening such that it is slidable and does not disengage therefrom. The spring guide 19 also has an opening which faces upward, and a spring 18 is arranged in this opening so as to constantly urge upward the cap-like base 12 to which the cleaning member 5 has been adhered. A supporting member 14 is mounted on the cap-like base 12 and is attached thereto by means of screws.

Figure 3:
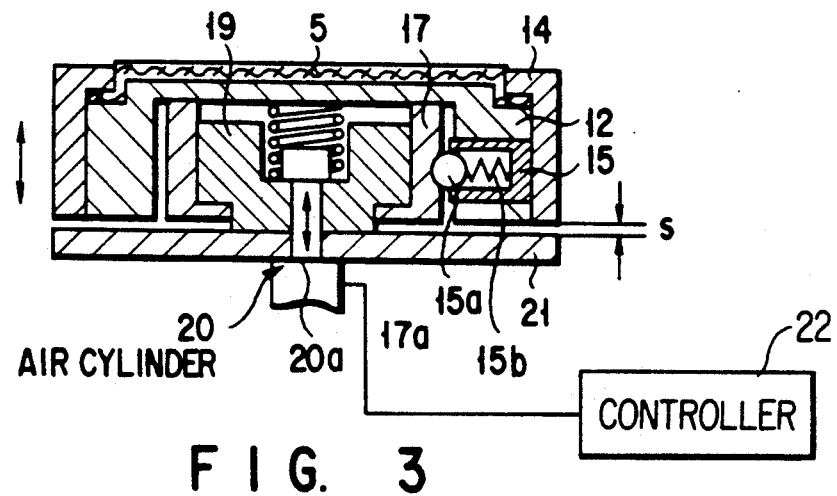
FIG. 3 shows in cross section the cleaning block attached to the mount.

The cleaning block having the above-mentioned structure is attached to the mount 4 as shown in FIG. 3. A lift plate 21 is arranged on a supporting member attached to the mount 4, and can be moved vertically. The spring guide 19 is affixed to the upper surface of the lift plate 21. A plurality of recesses 17a are formed in predetermined areas on the outer surface of the guide base 17, and balls 15a of spring plungers 15 inserted into the side walls of the cap-like base 12 are engaged with the recesses 17a. A predetermined gap S is provided between the lower surface of the cap-like case 12 and the upper surface of the lift plate 21. By virtue of the gap S, impact, due to the probe needle fixing block 2 comes into contact with the supporting member 14 of the cleaning block as a result of the vertical probe needles 1 being inserted into the cleaning member 5, can be lessened. Even if an error occurs in positioning the cleaning member 5 and the vertical probe needles 1 with respect to each other, the error can be compensated for by virtue of the gap S. It is desirable that the width of the gap S is in the order of 1 mm. In this case, the distance between the upper surface of the spring guide 19 and the inner surface of the cap-like base 12 which faces the above upper surface should be equal to or greater than the gap S. A plunger 20a of an air cylinder 20, serving as a lift means, is affixed to the lower surface of the lift plate 21 such that the cap-like base 12, the cleaning member 5 and the spring guide 19 can be moved up and down.

The probe apparatus of the present invention need only have such a structure as to allow the cleaning member 5 to contact the vertical probe needles. Therefore, the cleaning block may be affixed to the mount so as to be movable upward and downward together with the mount. It is preferable to provide a lift means for the cleaning block. It is more preferable to provide an elastic member to absorb pressure which the cleaning member applies to the vertical probe needles when it is brought into contact therewith. In this case, an air cylinder driven by a solenoid valve, or a gear mechanism driven by a motor, for example, can be used as the lift means. The elastic member is not necessary when a controller (23) is provided for controlling vertical movement of the cleaning member in accordance with the result of detection of the position of the vertical probe needles and the cleaning member relative to each other.

Figure 4A:
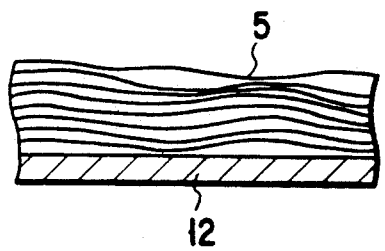
FIGS. 4A and 4B diagrammatically illustrate examples of the cleaning member used in the present invention.
Figure 4B:
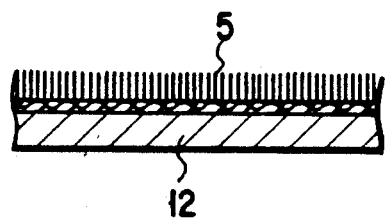

FIG. 4A shows an example of the cleaning member 5 used in the present invention. The cleaning member shown in this drawing comprises a cloth which is formed by weaving continuous extra fine fibers and by subjecting the resultant fabric to a chemical process such as high-shrinkage process. Polyamide resin, polyester resin or the like, can be used as the material of the fibers. It is desirable that the thickness of the fibers is in the order of 0.1 denier and that the fiber density is in the order of 80,000 number/cm$^2$. FIG. 4B shows another example of the cleaning member 5. In this drawing, the cleaning member comprises a cloth made up of a large number of extra fine fibers which are arranged so as to be raised like bristles. The thickness of the cloth made up of the extra fine fibers is preferably in the order of 1 mm.

The operation of the probe apparatus according to the present invention will now be explained. In the drawings mentioned hereinafter, it is not shown in detail how the guide base 17 and the spring guide 19 engage each other.

Figure 5A:
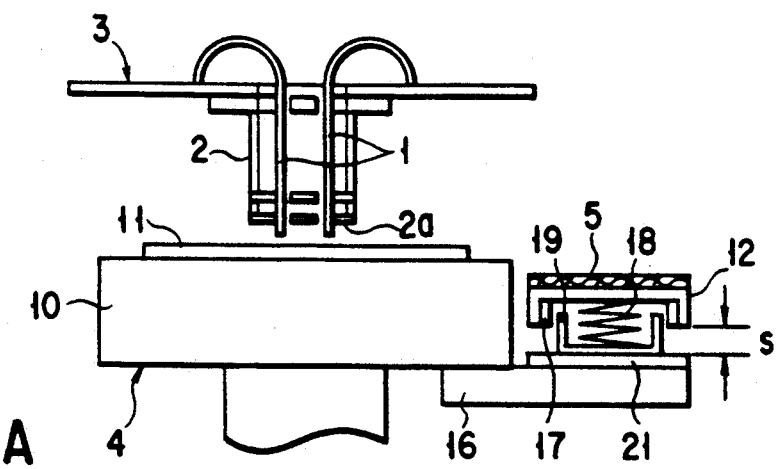
FIGS. 5A–5E are diagrams showing how the probe apparatus of the present invention operates.

FIG. 5A is a diagram showing the probe apparatus of the present invention. The vertical probe needles 1 are held by the probe needle fixing block 2 such that one end of each of the needles 1 projects in the order of e.g. 250 μm from a transparent plate 2a of the block 2. The needles 1 extend through the probe card 3, and their other ends are affixed to the upper surface thereof. The mount 4 on which the semiconductor wafer 11 is placed is moved in the X, Y, and Z directions, thus positioning the electrode pads, made of e.g. aluminum, and the vertical probe needles with respect to each other. In order to check electrical characteristics, the vertical probe needles 1 are brought into contact with the electrode pads by moving the probe card 3 downward or by moving the mount 4 upward. When such a checking procedure is performed a predetermined number of times, aluminum waste A adheres to the vertical probe needles. If the checking procedure is continued in such a state, the electrical connection between the vertical probe needles 1 and the electrode pads may deteriorate, resulting in inaccurate measurements.

Figure 5B:
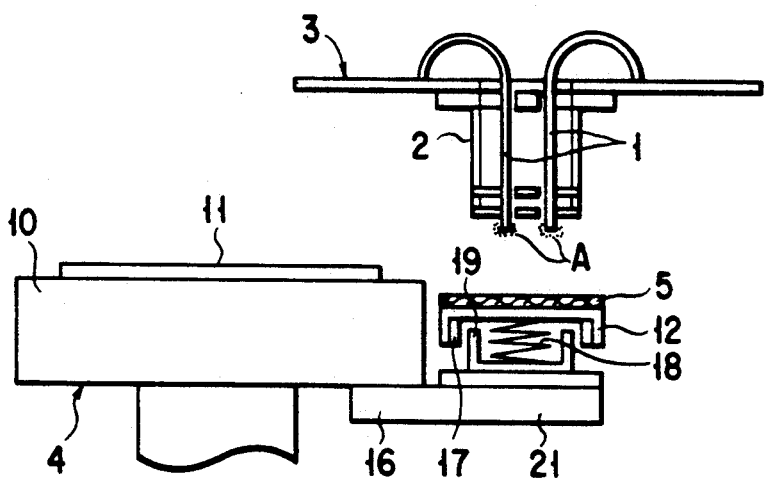
Figure 5C:
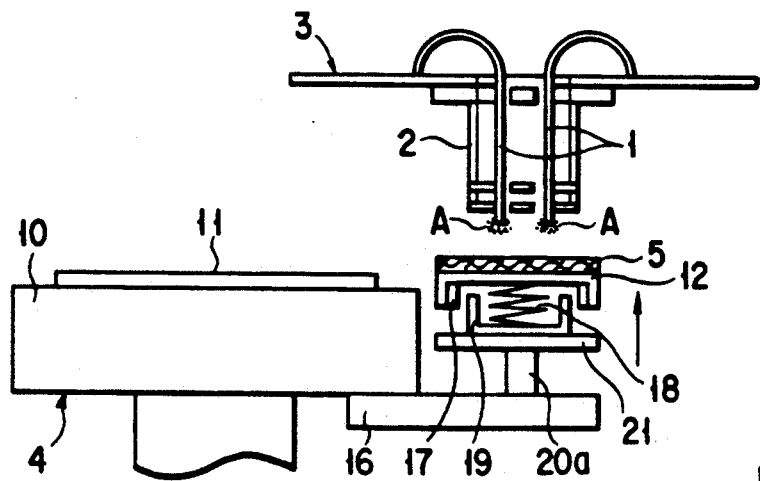
Figure 5D:
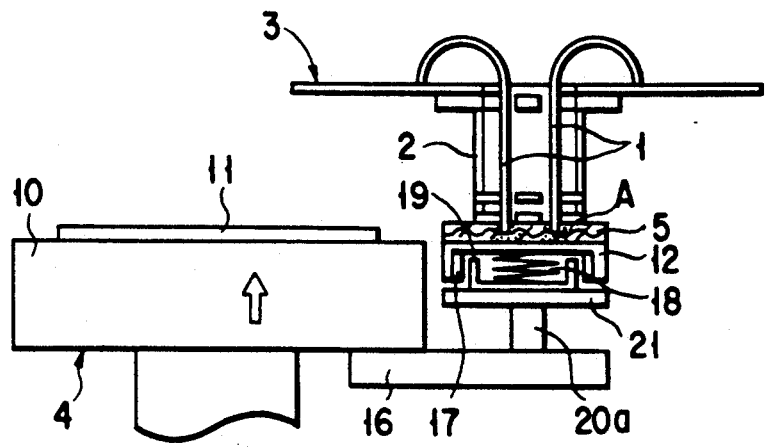

In consideration of the above, after the checking procedure is performed a predetermined number of times, the mount 4 is moved such that the cleaning member 5 is located below the vertical probe needles 1, as shown in FIG. 5B. Then, the plunger 20a is extended by actuating the air cylinder, as shown in FIG. 5C, after which the cleaning member 5 is brought into contact with the vertical probe needles 1 by moving the mount 4 in the Z direction, as shown in FIG. 5D.

Figure 6:
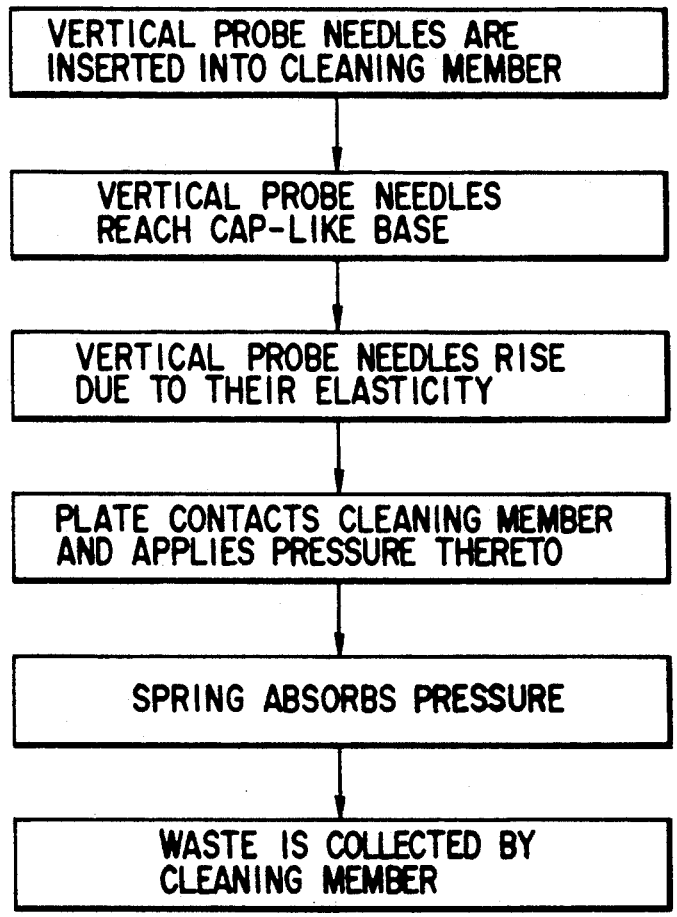
FIG. 6 is a flow chart explaining how the vertical probe needles are cleaned.

When the cleaning member 5 contacts the vertical probe needles 1, it is moved upward, whereby the needles 1 are inserted into the cleaning member 5 and reach the cap-like base 12 located under the member 5, as described in FIG. 6. At this time, the vertical probe needles 1 curve with their elasticity and rise to a certain degree, simultaneously with which the plate 2a of the probe needle fixing block 2 comes into contact with the cleaning member 5. The plate 2a applies pressure to the cleaning member 5, and the spring 18 absorbs the pressure. During the above-mentioned process, the aluminum waste A adhered to the vertical probe needles 1 and the probe needle fixing block 2 is removed by the cleaning member 5. It is preferable that the probe needle 1 rises by the resistance of the cleaning member 5 without reaching the probe needle 1 to cap-like base 12.

Figure 5E:
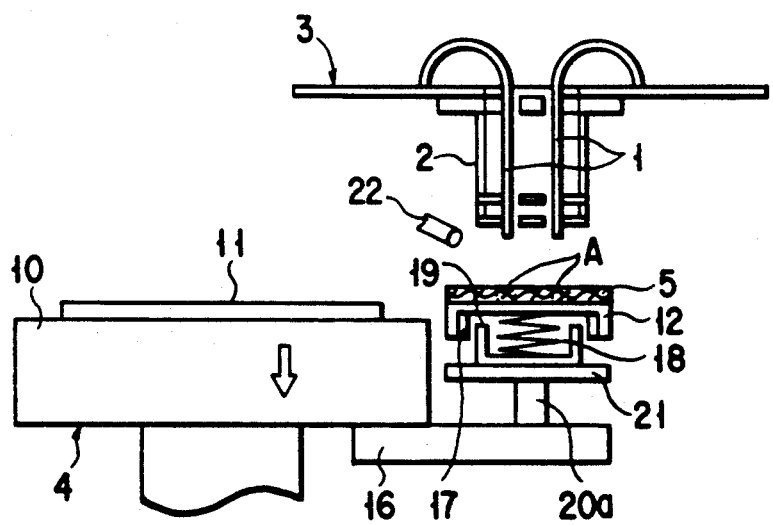

Then, as shown in FIG. 5E, the mount 4 is moved downward or the probe card 3 is moved upward, thus separating the cleaning member 5 from the vertical probe needles 1, after which the position of the cleaning member 5 and the vertical probe needles 1 relative to each other is changed by moving the mount 4, whereupon any aluminum waste left on the vertical probe needles 1 and the probe needle fixing block 2 is again removed in the same manner as described above. The reason for changing the position of the cleaning member 5 and the vertical probe needles 1 relative to each other is to avoid the aluminum waste A absorbed by the cleaning member 5 from adhering again to the vertical probe needles 1. The procedures shown in FIGS. 5D and 5E are repeated, thus cleaning the vertical probe needles 1. The aluminum waste A absorbed by the cleaning member 5 is not scattered, and can therefore be prevented from falling on the semiconductor wafer in the form of particles. A suction means 22 may be provided in the vicinity of the cleaning block in order to remove the aluminum waste A absorbed by the cleaning member. Since the cleaning member 5 does not rub the vertical probe needles 1, scrapings are not generated from the needles, ensuring that the needles have a long life.

The cleaning block is generally located in a position lower than the upper surface of the mount 4 such that the semiconductor wafer 11 can be smoothly placed on and removed from the chuck 10 of the mount 4.

As mentioned above, after the vertical probe needles 1 are cleaned, electrical characteristics can be checked again by bringing the needles 1 into contact with the electrode pads, as shown in FIG. 5A.

The maintenance of the vertical probe needles 1 of the probe apparatus can be automatically performed, as shown in FIG. 7, by controlling the probe apparatus in accordance with a program for cleaning the needles in the above-mentioned manner after the checking procedure is conducted a predetermined number of times. In addition, as the needle cleaning procedure is repeated, fine aluminum waste adhered to the vertical probe needles 1 is deposited on the cleaning member. Therefore, it is preferred to exchange the cleaning member for a new one after the needle cleaning procedure is performed a predetermined number of times. Exchanging the cleaning member for a new one means exchanging only the cloth made up of extra fine fibers for a new one. In the cleaning block shown in FIG. 3, the exchanging procedure can be easily performed by detaching the cap-like base 12 from the guide base 17 against the urging force applied by the spring 15b of the spring plunger 15.

As explained above, according to the probe apparatus of the present invention, the aluminum waste and the like which is adhered to the vertical probe needles can be removed, thus ensuring that the needles have a long life. The present invention does not incur the possibility that aluminum waste adhered to the vertical probe needles may fall on the object to be examined and degrade the quality thereof.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A probe apparatus comprising:
   a mount on which an object to be examined is placed;
   a large number of vertical probe needles, being brought into contact with electrode pads of the object to be examined, for measuring electrical characteristics of the object to be examined; and
   a cleaning block including a cleaning member for removing waste adhered to said vertical probe needles;
   wherein said cleaning member comprises a cloth which is made up of extra fine fibers.

2. The probe apparatus according to claim 1, wherein said cleaning block further includes an elastic member for absorbing pressure which is applied to said vertical probe needles when said vertical probe needles and said cleaning member contact each other.

3. The probe apparatus according to claim 2, wherein said elastic member is a spring.

4. The probe apparatus according to claim 1, wherein said cleaning block further includes lift means.

5. The probe apparatus according to claim 4, wherein said lift means is one of an air cylinder driven by a solenoid valve and a gear mechanism driven by a motor.

6. The probe apparatus according to claim 1, further comprising suction means, arranged in the vicinity of said cleaning member, for removing waste caught by said cleaning member.

7. The probe apparatus according to claim 1, wherein said cleaning block can be disassembled, and said cleaning member can be exchanged for a new one.

8. The probe apparatus according to claim 1, wherein said extra fine fibers are made of polyamide resin or polyester resin.

9. The probe apparatus according to claim 1, further comprising control means for detecting the position of said vertical probe needles and said cleaning member relative to each other and for controlling upward and downward movement of said cleaning member in accordance with the detection result.

* * * * *

UNITED STATES PATENT AND TRADEMARK OFFICE
CERTIFICATE OF CORRECTION

PATENT NO. :   5,220,279
DATED      :   June 15, 1993
INVENTOR(S) :  YASUSI NAGASAWA It is certified that error appears in the above-indentified patent and that said Letters Patent is hereby corrected as shown below:

In the Drawings:
    In Figure 3, change reference numeral "22" to --23--.

Signed and Sealed this

Twenty-second Day of February, 1994

Attest:

BRUCE LEHMAN

*Attesting Officer*     *Commissioner of Patents and Trademarks*